United States Patent
Jeong et al.

(10) Patent No.: US 9,435,020 B2
(45) Date of Patent: Sep. 6, 2016

(54) THIN FILM DEPOSITION APPARATUS AND METHOD OF FORMING THIN FILM USING THE SAME

(71) Applicant: Samsung Display Co., Ltd., Yongin, Gyeonggi-Do (KR)

(72) Inventors: Sang-Yong Jeong, Yongin (KR); Myung-Ki Lee, Yongin (KR); Sang-Youn Kim, Yongin (KR); You-Sung Jeon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/740,201

(22) Filed: Jun. 15, 2015

(65) Prior Publication Data

US 2015/0275347 A1    Oct. 1, 2015

Related U.S. Application Data

(62) Division of application No. 14/042,413, filed on Sep. 30, 2013, now Pat. No. 9,115,427.

(30) Foreign Application Priority Data

Apr. 15, 2013  (KR) .................. 10-2013-0041258

(51) Int. Cl.

| C23C 14/56 | (2006.01) |
| C23C 14/04 | (2006.01) |
| G01B 11/14 | (2006.01) |
| H01L 51/00 | (2006.01) |
| H01L 51/56 | (2006.01) |
| H01L 21/67 | (2006.01) |
| C23C 14/54 | (2006.01) |

(52) U.S. Cl.
CPC ............. *C23C 14/042* (2013.01); *C23C 14/54* (2013.01); *G01B 11/14* (2013.01); *H01L 21/67288* (2013.01); *H01L 51/0011* (2013.01); *H01L 51/56* (2013.01)

(58) Field of Classification Search
CPC ... H01L 51/56; H01L 51/0011; C23C 14/54; C23C 14/042; G01B 11/14
See application file for complete search history.

(56) References Cited

U.S. PATENT DOCUMENTS

| 6,142,660 A | 11/2000 | Utsunomiya et al. |
| 7,259,373 B2 | 8/2007 | Zani et al. |
| 7,292,348 B2 | 11/2007 | Akimoto |
| 8,124,597 B2 | 2/2012 | Mahuran et al. |
| 2008/0160431 A1 | 7/2008 | Scott et al. |
| 2011/0220022 A1 | 9/2011 | Hong et al. |
| 2013/0136850 A1 | 5/2013 | Doyle et al. |
| 2014/0199808 A1 | 7/2014 | Sugimoto et al. |
| 2014/0291620 A1 | 10/2014 | Choi et al. |

FOREIGN PATENT DOCUMENTS

| KR | 10-2007-0077548 | 7/2007 |
| KR | 10-2007-0080165 | 8/2007 |
| KR | 10-2008-0053065 | 6/2008 |

*Primary Examiner* — Bac Au
(74) *Attorney, Agent, or Firm* — Lewis Roca Rothgerber Christie LLP

(57) ABSTRACT

A thin film deposition apparatus includes: a chamber; a mask stage in the chamber and configured to support a mask; a jig in the chamber and above the mask stage, the jig being configured to move in a direction of the mask stage; and a rail in the chamber and configured to support the movement of the jig. Another thin film deposition apparatus includes a chamber, a mask stage positioned within the chamber and configured to support a mask, a camera part proximate to a side of the mask stage, and a jig above the mask stage and configured to move in a direction of the mask stage and over the camera part. The jig is further configured to radiate laser beams in a downward direction from the jig to obtain first scanning data regarding the mask stage and second scanning data regarding the camera part.

16 Claims, 3 Drawing Sheets

THIN FILM DEPOSITION APPARATUS AND METHOD OF FORMING THIN FILM USING THE SAME

CROSS-REFERENCE TO RELATED APPLICATION

This application is a divisional of U.S. patent application Ser. No. 14/042,413, filed Sep. 30, 2013, which claims priority to and the benefit of Korean Patent Application No. 10-2013-0041258, filed Apr. 15, 2013, the entire content of both of which is incorporated herein by reference.

BACKGROUND

1. Field

Aspects of embodiments of the present invention relate to a thin film deposition apparatus, and a method of forming a thin film using the thin film deposition apparatus.

2. Description of the Related Art

Semiconductor devices, display devices, etc., have a plurality of thin films, and some of these thin films are formed with specific patterns. Deposition using a mask is a widely used method of forming a thin film having these specific patterns. To form a thin film having such specific patterns using deposition with a mask, a tight interval and alignment between the mask and a substrate should be precisely controlled. For this precise control, a mask, or a mask stage for mounting the mask thereon, or any other significant component of the deposition process, may be made as flat (e.g., level or correctly positioned) as possible before the deposition process.

However, although the mask stage or the like may be made flat before performing the deposition process, the flatness of the mask stage or the like may vary over process time. For example, the mask stage or the like may become tilted or misshaped from use or due to variations in temperature, vacuum, or the like in a deposition chamber.

Thus, the flatness, tilting, etc., of the mask stage or the like varies over time. Accordingly, whether or not the mask stage or the like is abnormal (e.g., not flat) may not be known until after failure of the corresponding formed thin film pattern has been confirmed. At this point, the vacuum of the chamber is removed, the mask stage, mask, etc., are unloaded from the chamber, and whether or not the mask stage, mask, etc., are abnormal is confirmed. This complicated process may reduce the efficiency of the thin film deposition process.

In addition, in the alignment between the substrate and the mask, position information regarding the substrate and the mask may be obtained by using camera parts, such as a gap sensor and a camera, whose positions may function as zero points for alignment of the substrate, the mask, and the like. However, the gap sensor and the camera may vary from their otherwise fixed positions due to factors such as external impact, variation in vacuum degree, etc. Thus, when the positions of the gap sensor and the camera functioning as zero points for alignment of the substrate, the mask, and the like are changed, it may be difficult to obtain precise alignment information regarding the substrate, the mask, and the like. Accordingly, the reliability of the thin film deposition process may be reduced.

SUMMARY

Aspects of embodiments of the present invention relate to a thin film deposition apparatus having enhanced deposition efficiency, and a method of forming thin film using the thin film deposition apparatus. Embodiments of the present invention provide for a thin film deposition apparatus that may enhance the efficiency of a thin film process by rapidly determining whether or not the flatness of a mask stage or the like is abnormal, and a method of depositing a thin film using the thin film deposition apparatus.

In an embodiment of the present invention, a thin film deposition apparatus is provided. The thin film deposition apparatus includes: a chamber; a mask stage in the chamber and configured to support a mask; a jig in the chamber and above the mask stage, the jig being configured to move in a direction of the mask stage; and a rail in the chamber and configured to support the movement of the jig.

The rail may include a pair of rails that are parallel to each other and to edges of the mask stage.

The jig may be connected to the pair of rails by a connecting part. The connecting part may include a driving part for moving the jig.

The jig may be configured to radiate one or more laser beams in a downward direction from the jig to obtain data regarding a structure under the jig.

The thin film deposition apparatus may further include a controller configured to receive scanning data regarding the structure from the jig.

The structure may be the mask stage. The jig may be further configured to radiate the laser beams onto an upper surface of the mask stage. The controller may be further configured to determine flatness and tilting of the mask stage from the scanning data.

The mask may be mounted on the mask stage. The structure may be the mask. The jig may be further configured to radiate the laser beams onto a surface of the mask. The controller may be further configured to determine flatness of the mask from the scanning data.

The thin film deposition apparatus may further include a camera part proximate to a side of the mask stage. The jig may be further configured to move over the camera part.

The structure may be the camera part. The jig may be further configured to radiate the laser beams onto the camera part to obtain the scanning data.

The controller may be further configured to determine a change in position of the camera part from the scanning data.

In another embodiment of the present invention, a thin film deposition apparatus is provided. The thin film deposition apparatus includes a chamber, a mask stage positioned within the chamber and configured to support a mask, a camera part proximate to a side of the mask stage, and a jig above the mask stage and configured to move in a direction of the mask stage and over the camera part. The jig may be further configured to radiate laser beams in a downward direction from the jig to obtain first scanning data regarding the mask stage and second scanning data regarding the camera part.

The thin film deposition apparatus may further include a controller configured to receive the first and second scanning data.

The controller may be further configured to determine flatness or tilting of the mask stage from the first scanning data.

The controller may be further configured to determine a change in position of the camera part by comparing the first and second scanning data with reference position data.

The thin film deposition apparatus may further include a pair of rails parallel to sides of the mask stage. The jig may be configured to move along the pair of rails.

The jig may be connected to the pair of rails by a connecting part. The connecting part may include a driving part for moving the jig.

In yet another embodiment of the present invention, a method of forming a thin film is provided. The method includes radiating one or more laser beams from a jig onto a surface of a mask stage while moving the jig in a direction of the mask stage, receiving the laser beams reflected from the mask stage by the jig to obtain first scanning data regarding the mask stage, transmitting the first scanning data from the jig to a controller, determining flatness or tilting of the mask stage at the controller from the first scanning data, and performing a subsequent deposition when the controller determines that the surface of the mask stage is flat or not tilted.

The method may further include moving the jig over a camera part proximate to a side of the mask stage while radiating the one or more laser beams from the jig onto a surface of the camera part, and receiving the laser beams reflected from the camera part to obtain second scanning data regarding the camera part.

The method may further include receiving the second scanning data at the controller from the jig, and comparing the first and second scanning data with reference position data at the controller to determine a change in position of the camera part.

The obtaining of the first scanning data may include measuring a time taken from the radiating of the laser beams onto the surface of the mask stage to the receiving of the laser beams reflected from the mask stage.

The obtaining of the second scanning data may include measuring a time taken from the radiating of the laser beams onto the surface of the camera part to the receiving of the laser beams reflected from the camera part.

The subsequent deposition may include positioning the mask on the mask stage, measuring flatness of the mask using the jig, aligning a substrate on the mask, and forming a thin film in a form corresponding to a pattern of the mask on the substrate using a deposition source.

The measuring of the flatness of the mask may take place after the positioning of the mask.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
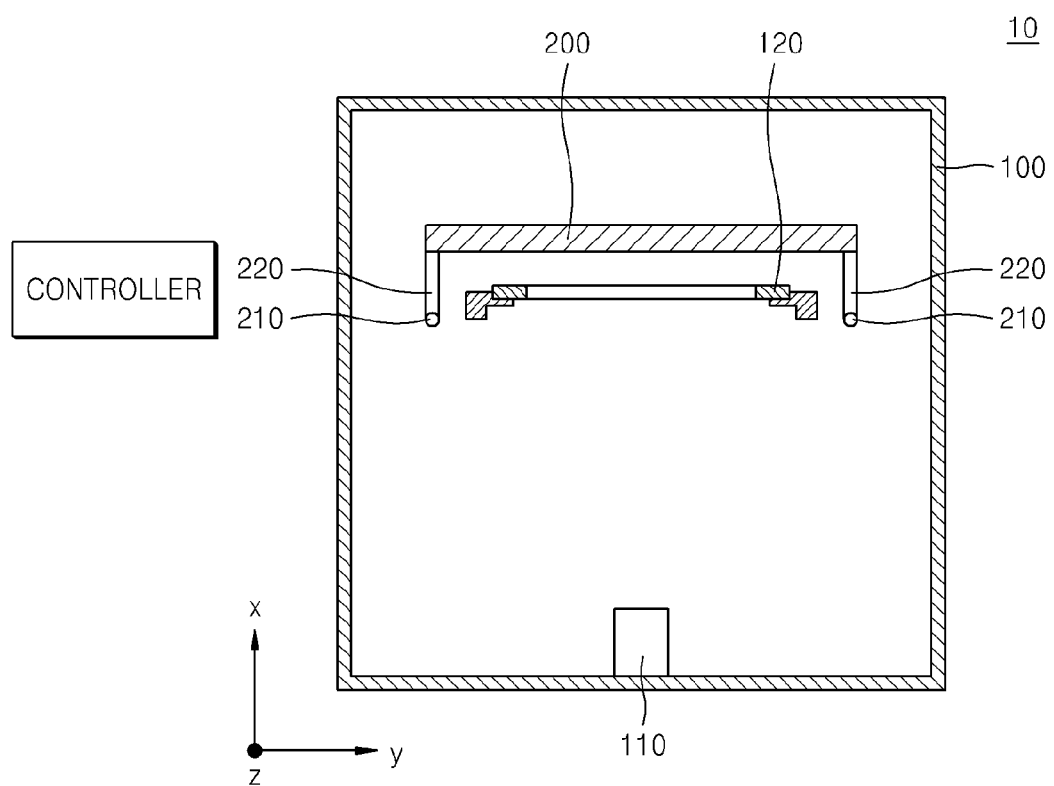
FIG. 1 is a cross-sectional view schematically illustrating a thin film deposition apparatus according to an embodiment of the present invention.

The present invention may be variously modified and may include various embodiments. However, example embodiments are illustrated in the drawings and will be described in detail. It should be understood, however, that it is not intended to limit the present invention to the particular described embodiments, but rather, the disclosure is intended to cover all modifications, equivalents, and alternatives falling within the spirit and scope of the invention as defined by the claims and their equivalents. Moreover, detailed descriptions related to functions or configurations that are well known to those of ordinary skill in the art may be omitted in order to not unnecessarily obscure subject matter of the present invention.

Relational terms such as 'first', 'second', and the like may be used for describing various elements, but the elements should not be limited by the terms. These terms are only used to distinguish one element from another. In the description, it will be understood that when an element such as a layer, film, region, or substrate is referred to as being "above" or "on" another element, it can be directly on the other element or intervening elements may also be present.

The present invention will now be described more fully with reference to the accompanying drawings, in which substantially the same or corresponding elements are indicated by the same numerals and thus their repeated description may be reduced or omitted. In the drawings, some elements may be omitted or exaggerated for convenience of description. Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

Figure 2:
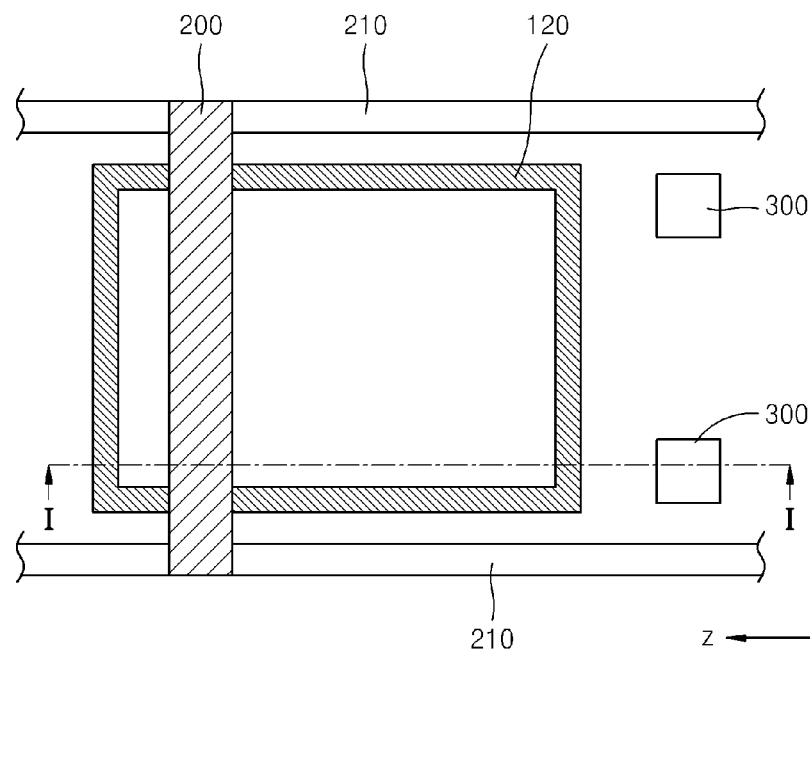
FIG. 2 is a plan view schematically illustrating the thin film deposition apparatus of FIG. 1.
Figure 3:
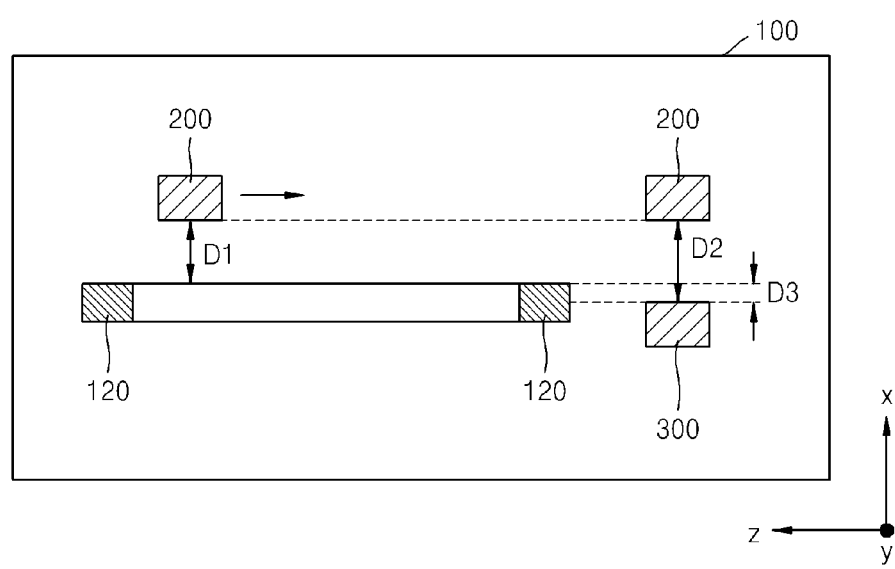
FIG. 3 is a cross-sectional view taken along the line I-I of FIG. 2.

FIG. 1 is a cross-sectional view schematically illustrating a thin film deposition apparatus 10 according to an embodiment of the present invention. FIG. 2 is a plan view schematically illustrating the thin film deposition apparatus 10 of FIG. 1. FIG. 3 is a cross-sectional view taken along the line I-I of FIG. 2.

Referring to FIGS. 1 to 3, the thin film deposition apparatus 10 may include a chamber 100, a mask stage 120 on which a mask (see, for example, mask 130 in FIG. 5) is mounted, a jig 200 disposed above the mask stage 120 and that moves in a direction of the mask stage 120 (for example, in a direction parallel to sides, such as opposing sides, of the mask stage 120), and one or more camera parts 300 for obtaining position information regarding the substrate and the mask.

The chamber 100 accommodates the mask stage 120, the jig 200, a deposition source 110, and the like. A pump for forming an atmosphere such as vacuum pressure as may be needed for a deposition process may be connected to the chamber 100. The chamber 100 may be further provided with at least one inlet/outlet for loading or unloading the substrate into the chamber 100.

The mask stage 120, on which the mask is positioned and mounted, prevents the mask from moving or shaking during the deposition process. The mask stage 120 may have an opening formed at a center thereof such that a pattern of the mask is exposed, and may be formed of a material having high heat resistance and durability to prevent or reduce deformation and damage due to heat during the deposition process.

The jig 200 is positioned above the mask stage 120, moves in a direction of the mask stage 120 (e.g., parallel to sides of the mask stage 120), and radiates one or more laser beams in a downward direction from the jig 200 to obtain scanning data regarding structures (e.g., the mask stage 120, the mask, etc.) positioned under the jig 200. The jig 200 may be provided with a laser radiation part for radiating the laser beams in a downward direction from the jig 200, and a laser receiving part for receiving the laser beams reflected from the structures (e.g., the mask stage 120, the mask, etc.) positioned under the jig 200.

When the structure positioned under the jig 200 is, for example, the mask stage 120, the jig 200 radiates the laser beams onto a surface (upper surface) of the mask stage 120 through the laser radiation part while moving in a direction of the mask stage 120 above the mask stage 120 that is not provided with a mask. In addition, the laser receiving part receives the laser beams reflected from the mask stage 120. At this time, scanning data regarding the mask stage 120 may be obtained by measuring the time taken from the radiating of the laser beams to the receiving of the reflected laser beams.

The scanning data regarding the mask stage 120 obtained by the jig 200 is transmitted to a controller. The controller may be positioned outside the chamber 100, and may communicate with the jig 200 through a local area communication or a cable. The controller may analyze the received scanning data regarding the mask stage 120, and compare the same with reference data to determine the flatness of the mask stage 120.

For example, when it is assumed that the reference time taken from the radiating of the laser beam to the receiving of the reflected laser beam between the jig 200 and the mask stage 120 is T1 in a normal operation, if a value of the measured scanning data regarding the mask stage 120 is less than T1, it is determined that foreign particles may exist on the mask stage 120.

In addition, if the measured scanning data regarding the mask stage 120 continuously increases or decreases in one direction, it may be determined that the mask stage 120 is tilted in a direction. Therefore, more rapid and correct determination and action may be possible by directly measuring whether or not the mask stage 120 is abnormal before the deposition process is performed (and incorrect or defective thin films are formed), thus enhancing the efficiency of the thin film deposition process.

A mask is mounted on the mask stage 120. The mask may have a specific pattern formed thereon, corresponding to a pattern to be formed on the substrate. To form a thin film on the substrate in a form corresponding to the pattern formed on the mask, it may be required that a fine interval and alignment (e.g., a tight interval and alignment) between the mask and the substrate be precisely controlled.

For this purpose, the camera part (or camera parts) 300 may be positioned at or near (such as proximate to) a side of the mask stage 120. The camera part 300 may include, for example, a gap sensor and a camera. While it is described that the camera part 300 is used as a collective name of the gap sensor and the camera for convenience of description, the gap sensor and the camera may be placed at different positions (e.g., locations of one or more camera parts 300).

The gap sensor is a device for measuring a clearance between the mask and the substrate, and the camera is used for confirming a point on the substrate where a thin film should be formed, and determining the positions of the substrate and the mask. The camera part or parts 300, including the gap sensor and the camera, may function as a zero point in the alignment between the substrate and the mask. That is, since the positions of the substrate and the mask are determined based on the one or more camera parts 300, the position(s) of the camera parts 300 may have to be fixed.

However, the camera parts 300 may vary from the fixed positions due to factors such as external impact or change of a vacuum degree. When the position of the camera parts 300 changes, it may be difficult to obtain precise position information regarding the substrate, and thus a thin film may not be deposited at a desired target point. Therefore, for the reliability and efficiency of the process, it would help to confirm whether or not the position of the camera part 300 has changed.

For this, the above described jig 200 moves over and scans the camera part 300 to obtain the position information regarding the camera part 300. That is, the structure positioned under the above-described jig 200 is the camera part 300, and the jig 200 may radiate one or more laser beams to the camera part 300 (such as to a surface of the camera part 300) to obtain the scanning data regarding the camera part 300.

In one example, the scanning data regarding the camera part 300 may be obtained by measuring the time taken from the radiating of the laser beam toward the camera part 300 to the receiving of the laser beam reflected from the camera part 300. The obtained scanning data regarding the camera part 300 is transmitted to the controller, and the controller compares the scanning data regarding the mask stage 120 and the scanning data regarding the camera part 300 with set or reference position data (e.g., preset position data) to determine a position change of the camera part 300. For example, the preset position data may be a height difference D3 between the mask stage 120 and the camera part 300.

The controller may measure an interval D1 between the jig 200 and the mask stage 120 and an interval D2 between the jig 200 and the camera part 300 at the same height from the received scanning data regarding the mask stage 120 and the received scanning data regarding the camera part 300, and calculate a height difference D2–D1 between the mask stage 120 and the camera part 300. The height difference D2–D1 between the mask stage 120 and the camera part 300 calculated thus may be compared with the preset position data D3 to easily determine whether or not the camera part 300 is fixed at an initial position. Therefore, since a change in position of the camera part 300 functioning as a zero point in the alignment of a substrate is rapidly obtained, the reliability of the thin film deposition process may be enhanced.

Additionally, the camera part 300 may include a three-axis driving mechanism (as is known to one of ordinary skill in the art) that is movable in X-, Y-, and Z-axes. Therefore, when it is determined that the position of the camera part 300 has changed, the position of the camera part 300 may be adjusted by the three-axis driving mechanism.

The jig 200 may move along a rail part. More specifically, the rail part may include a pair of rails 210 disposed along opposing sides of the mask stage 120, and the jig 200 may be connected to the pair of rails 210 through a connecting part (or a pair of corresponding connecting parts) 220.

The pair of rails 210 may be formed, for example, crossing the chamber 100. By doing so, the jig 200 may move to an upper side of the camera part 300, and may move to an edge of the chamber 100 during the deposition process to not hinder the deposition process.

The connecting part or parts 220 may be formed to be vertical to (e.g., above) the rails 210 and may include a driving part for generating a driving force for moving the jig 200. The driving part may include a motor, etc.

Figure 4:
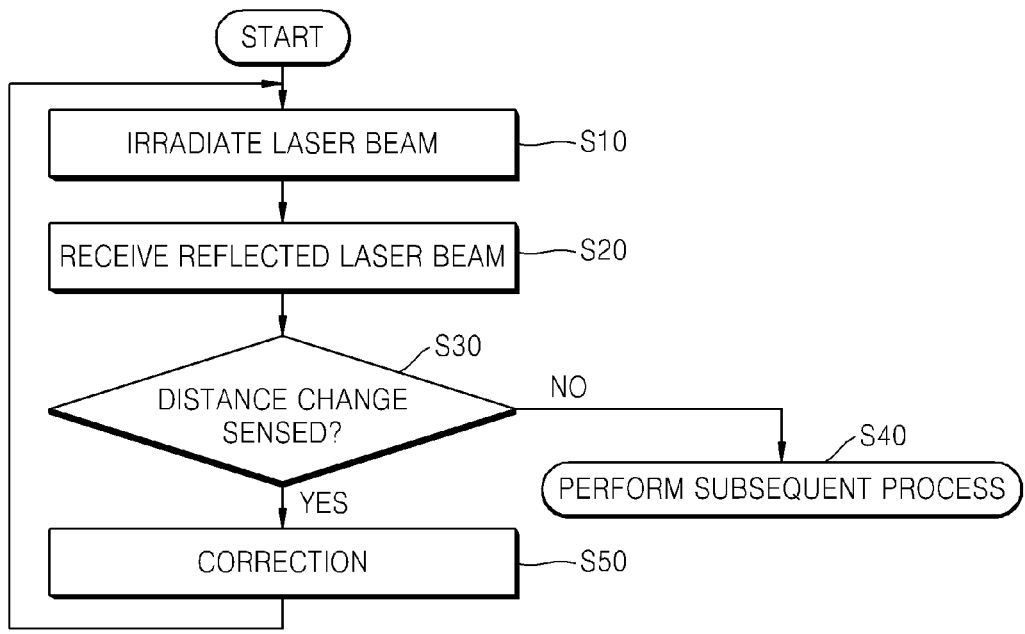
FIG. 4 is a flow diagram of a method of measuring flatness of components of the thin film deposition apparatus of FIG. 1.

FIG. 4 is a flow diagram of a method for measuring flatness of components of the thin film deposition apparatus 10 of FIG. 1, and more specifically, shows a process flow of scanning the mask stage 120 prior to performing a deposition process. Hereinafter, a thin film deposition process will be described with reference to FIG. 4 and FIGS. 1 to 3.

The thin film deposition process may generally include an operation of testing the flatness of the mask stage 120, and an operation of performing a subsequent deposition. Other components of the thin film deposition apparatus 10 may be similarly tested.

The operation of testing the flatness of the mask stage 120 may include radiating (S10) laser beams in a downward direction from the jig 200, receiving (S20) the reflected laser beams by the jig 200, and sensing (S30) a change of distance using measured scanning data, as shown in FIG. 4.

More specifically, the radiating (S10) of the laser beams in the downward direction from the jig 200 indicates that the jig 200 radiates laser beams onto the mask stage 120 positioned under the jig 200 while moving in a direction of the mask stage 120. The receiving (S20) of the reflected laser beams indicates receiving the laser beams reflected from the mask stage 120. The radiating (S10) of the laser beams and the receiving (S20) of the reflected laser beams may be substantially performed almost at the same time while the jig 200 moves in a direction. The jig 200 obtains the scanning data regarding the mask stage 120 by such a scanning and transmits the obtained data to the controller.

The scanning data regarding the mask stage 120 may be obtained by measuring the time taken from the radiating of the laser beams toward the mask stage 120 to the receiving of the laser beams reflected from the mask stage 120, and the controller may determine, for example, the flatness and tilting of the mask stage 120 from the obtained data.

More specifically, when a value of the scanning data regarding the measured mask stage 120 is less than a reference value (e.g., a preset reference value), it is interpreted (for example, by the controller) that the time taken from the radiating of the laser beams toward the mask stage 120 to the receiving of the laser beams reflected from the mask stage 120 is shorter than the reference time, and thus it may be determined that foreign particles or the like exist on the mask stage 120 at that position. Therefore, it may be sensed (S30) that the distance between the mask stage 120 and the jig 200 has changed at a specific point. In addition, if the measured scanning data regarding the mask stage 120 continuously increases or decreases in one direction, it may be determined that the mask stage 120 is tilted in a direction.

Thus, when it is determined that no distance change is sensed, a subsequent operation (S40) may be performed. On the other hand, when a distance change is sensed (for example, the mask stage 120 is not flat or is tilted), a correction (S50) to the mask stage 120 may be performed, and the above-described operations may be repeated. While the jig 200 moves over the camera part 300 positioned at or near (e.g., proximate to) a side of the mask stage 120, operations S10 to S30 may be concurrently performed on the camera part 300. That is, the jig 200 radiates laser beams to the camera part 300, receives the laser beams reflected from the camera part 300 to obtain the scanning data regarding the camera part 300, and transmits the obtained scanning data to the controller.

The scanning data regarding the camera part 300 may be obtained by measuring the time taken from the radiating of the laser beams toward the camera part 300 to the receiving of the laser beams reflected from the camera part 300. As aforementioned, the controller may measure the height difference between the mask stage 120 and the camera part 300 using the scanning data of the mask stage 120 and the scanning data of the camera part 300, and may compare the measured height difference with the preset position data of the camera part 300 to sense a distance change of the camera part 300.

Thus, when it is determined that no distance change is sensed, a subsequent operation (S40) is performed. On the other hand, when a distance change is sensed, a correction (S50) to the camera part 300 is performed, and the above-described operations may be repeated.

The subsequent operation may be a deposition process, and may include positioning the mask on the mask stage 120, aligning the substrate with the mask, and forming a thin film on the substrate in a form corresponding to the pattern of the mask. The thin film deposition method may further include positioning the mask on the mask stage 120 and then scanning a surface of the mask using the jig 200. This operation will be described later with reference to FIG. 5.

Thus, more rapid and correct determination and action may be possible by directly measuring whether or not the mask stage 120 is abnormal (e.g., not level, misshaped, etc.) before the deposition process is performed, thus enhancing the efficiency of the thin film deposition process. In addition, since a change in position of the camera part 300 functioning as a zero point in the alignment of a substrate is rapidly obtained, the reliability of the thin film deposition process may be enhanced.

Figure 5:
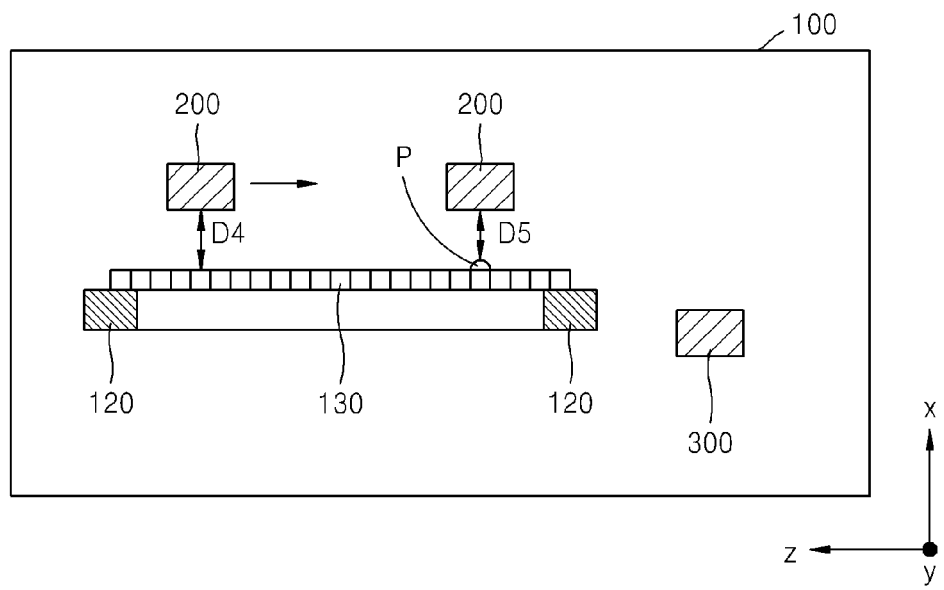
FIG. 5 is another cross-sectional view taken along the line I-I of FIG. 2.

FIG. 5 is another cross-sectional view taken along the line I-I of FIG. 2, this time further illustrating a mask 130 that is mounted on the mask stage 120. However, since the mask stage 120, the jig 200, and the camera part 300 of FIG. 5 may be the same as those shown in FIG. 3, descriptions thereof will not be repeated.

As illustrated in FIG. 5, when the mask 130 is mounted on the mask stage 120, the structure positioned under the jig 200 may be the mask 130, and the jig 200 may obtain scanning data regarding the mask 130 by a scanning operation. The method of scanning the surface of the mask 130 using the jig 200 may be the same as the method of scanning the mask stage 120 described with reference to FIGS. 1 to 4.

That is, while the jig 200 moves in a direction of the mask stage 120, on which the mask 130 is mounted, the jig 200 may radiate laser beams onto a surface of the mask 130 and receive laser beams reflected from the surface of the mask 130 to obtain scanning data regarding the mask 130. The obtained scanning data regarding the mask 130 is transmitted to the controller, and the controller may determine the flatness of the mask 130 from the received scanning data.

In an example, the controller may display the surface of the mask 130 in a three-dimensional image (for example, using a three-dimensional display device or a two-dimensional rendition of the three-dimensional image on a two-dimensional display device) using the received scanning data regarding the mask 130. Through the displayed three-dimensional image, the flatness of the mask 130 may be easily determined, and a defect or the like existing on the surface of the mask 130 may be easily determined.

The scanning data regarding the mask 130 may be obtained by measuring the time taken from the radiating of the laser beams toward the mask 130 to the receiving of the laser beams reflected from the mask 130, and the controller may calculate the distance between the jig 200 and the mask 130 from the obtained time data. For example, when particles (P) exist on the surface of the mask 130, the distance between the jig 200 and the mask 130 may decrease from D4 to D5. On the contrary, when the mask 130 has a defect, such as a groove or the like, the distance between the jig 200 and the mask 130 may have a value greater than D4.

Thus, more rapid and correct determination and action may be possible by directly measuring whether or not the mask stage 120 is abnormal before the deposition process is performed, thus enhancing the efficiency of the thin film deposition process.

According to embodiments of the present invention, since information about whether or not the flatness or other aspects of the shape or position of the mask stage or the like is abnormal may be rapidly obtained, the efficiency of the thin film deposition process may be enhanced. In addition, since a change in position of the camera part functioning as a zero point in the alignment of a substrate is rapidly obtained, the reliability of the thin film deposition process may be enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A thin film deposition apparatus comprising:
a chamber;
a mask stage in the chamber and configured to support a mask;
a jig in the chamber and above the mask stage, the jig being configured to move in a direction of the mask stage and comprising a laser radiating part configured to radiate a laser beam at the mask stage or the mask; and
a rail in the chamber and configured to support the movement of the jig.

2. The thin film deposition apparatus of claim 1, wherein the rail comprises a pair of rails that are parallel to each other and to edges of the mask stage.

3. The thin film deposition apparatus of claim 2, wherein the jig is connected to the pair of rails by a connecting part, and
the connecting part comprises a driving part for moving the jig.

4. A thin film deposition apparatus comprising:
a chamber;
a mask stage in the chamber and configured to support a mask;
a jig in the chamber and above the mask stage, the jig being configured to move in a direction of the mask stage; and
a rail in the chamber and configured to support the movement of the jig,
wherein the jig is configured to radiate one or more laser beams in a downward direction from the jig to obtain data regarding a structure under the jig.

5. The thin film deposition apparatus of claim 4, further comprising a controller configured to receive scanning data regarding the structure from the jig.

6. The thin film deposition apparatus of claim 5, wherein the structure is the mask stage,
the jig is further configured to radiate the laser beams onto an upper surface of the mask stage, and
the controller is further configured to determine flatness and tilting of the mask stage from the scanning data.

7. The thin film deposition apparatus of claim 5, wherein the mask is mounted on the mask stage,
the structure is the mask,
the jig is further configured to radiate the laser beams onto a surface of the mask, and
the controller is further configured to determine flatness of the mask from the scanning data.

8. The thin film deposition apparatus of claim 5, further comprising a camera part proximate to a side of the mask stage, wherein the jig is further configured to move over the camera part.

9. The thin film deposition apparatus of claim 8, wherein the structure is the camera part, and
the jig is further configured to radiate the laser beams onto the camera part to obtain the scanning data.

10. The thin film deposition apparatus of claim 9, wherein the controller is further configured to determine a change in position of the camera part from the scanning data.

11. A thin film deposition apparatus comprising:
a chamber;
a mask stage positioned within the chamber and configured to support a mask;
a camera part proximate to a side of the mask stage; and
a jig above the mask stage and configured to move in a direction of the mask stage and over the camera part,
wherein the jig is further configured to radiate laser beams in a downward direction from the jig to obtain first scanning data regarding the mask stage and second scanning data regarding the camera part.

12. The thin film deposition apparatus of claim 11, further comprising a controller configured to receive the first and second scanning data.

13. The thin film deposition apparatus of claim 12, wherein the controller is further configured to determine flatness or tilting of the mask stage from the first scanning data.

14. The thin film deposition apparatus of claim 13, wherein the controller is further configured to determine a change in position of the camera part by comparing the first and second scanning data with reference position data.

15. The thin film deposition apparatus of claim 11, further comprising a pair of rails parallel to sides of the mask stage, wherein the jig is configured to move along the pair of rails.

16. The thin film deposition apparatus of claim 15, wherein
the jig is connected to the pair of rails by a connecting part, and
the connecting part comprises a driving part for moving the jig.

* * * * *